US010254169B2

(12) United States Patent
Poutous et al.

(10) Patent No.: US 10,254,169 B2
(45) Date of Patent: Apr. 9, 2019

(54) OPTICAL DETECTOR BASED ON AN ANTIREFLECTIVE STRUCTURED DIELECTRIC SURFACE AND A METAL ABSORBER

(71) Applicant: The University Of North Carolina At Charlotte, Charlotte, NC (US)

(72) Inventors: Menelaos K. Poutous, Charlotte, NC (US); Ishwar D. Aggarwal, Charlotte, NC (US); Jasbinder S. Sanghera, Charlotte, NC (US); Lynda E. Busse, Charlotte, NC (US); Brandon L. Shaw, Woodbridge, VA (US)

(73) Assignees: The Government of the United States of America, as represented by the Secretary of the Navy, Washington, DC (US); The University of North Carolina at Charlotte, Charlotte, NC (US)

(*) Notice: Subject to any disclaimer, the term of this patent is extended or adjusted under 35 U.S.C. 154(b) by 28 days.

(21) Appl. No.: 15/508,951

(22) PCT Filed: Aug. 6, 2015

(86) PCT No.: PCT/US2015/043967
§ 371 (c)(1),
(2) Date: Mar. 6, 2017

(87) PCT Pub. No.: WO2016/069083
PCT Pub. Date: May 6, 2016

(65) Prior Publication Data
US 2018/0238739 A1    Aug. 23, 2018

Related U.S. Application Data

(60) Provisional application No. 62/048,061, filed on Sep. 9, 2014.

(51) Int. Cl.
*G02F 1/01*   (2006.01)
*G01J 5/08*   (2006.01)
(Continued)

(52) U.S. Cl.
CPC .......... *G01J 5/0853* (2013.01); *G01J 5/0803* (2013.01); *G01J 5/10* (2013.01); *G01J 5/12* (2013.01);
(Continued)

(58) Field of Classification Search
CPC ............ H01L 33/38; H01L 31/022425; H01L 31/0725; H01L 31/076; H01L 2933/0016;
(Continued)

(56) References Cited

U.S. PATENT DOCUMENTS 3,642,529 A    2/1972  Lee et al.
4,448,487 A    5/1984  Cuomo et al.
(Continued)

OTHER PUBLICATIONS

Lee et al., "Fabrication of broadband anti-reflective sub-micron structures using polystyrene sphere lithography on a Si substrate," 2014, Photonics and Nanostructures—Fundamentals and Applications, vol. 12, pp. 16-22.*
(Continued)

*Primary Examiner* — Kiho Kim
(74) *Attorney, Agent, or Firm* — Clements Bernard Walker PLLC; Christopher L. Bernard

(57) ABSTRACT

The present invention provides an optical detector device, including: a metal absorber layer; and a dielectric cover layer coupled to the metal absorber layer, wherein the dielectric cover layer includes one or more antireflective structured surfaces. The optical detector device further includes one or more of a passive substrate layer and an active thermoelectric element layer coupled to the metal absorber layer opposite the dielectric cover layer. The one or more antireflective structured surfaces each utilize a random pattern.

20 Claims, 4 Drawing Sheets

(51) Int. Cl.

| | |
|---|---|
| *G02B 1/118* | (2015.01) |
| *G02B 1/11* | (2015.01) |
| *G01J 5/10* | (2006.01) |
| *G01J 5/12* | (2006.01) |
| *G01J 5/34* | (2006.01) |
| *H01L 35/10* | (2006.01) |
| *G01J 5/06* | (2006.01) |

(52) U.S. Cl.
CPC .................. *G01J 5/34* (2013.01); *G02B 1/11* (2013.01); *G02B 1/118* (2013.01); *H01L 35/10* (2013.01); *G01J 2005/068* (2013.01)

(58) Field of Classification Search
CPC ..... H01L 2933/0091; H01L 2924/0002; H01L 2924/00; Y02E 10/548; G01J 5/0853; G01J 5/34; G01J 5/10; G01J 5/0803; G01J 5/12; G01J 2005/068; G02B 1/11; G02B 1/118
See application file for complete search history.

(56) References Cited

U.S. PATENT DOCUMENTS

| | | | |
|---|---|---|---|
| 4,754,139 A | 6/1988 | Ennulat et al. | |
| 4,988,641 A | 1/1991 | Solomon | |
| 5,962,854 A | 10/1999 | Endo | |
| 6,133,572 A | 10/2000 | Cunningham | |
| 6,690,014 B1 | 2/2004 | Gooch et al. | |
| 9,285,584 B2* | 3/2016 | Hebrink ................ B82Y 20/00 | |
| 2005/0081905 A1* | 4/2005 | Lan .......................... G01K 7/04 | |
| | | | 136/224 |
| 2007/0115554 A1* | 5/2007 | Breitung ............... G02B 1/118 | |
| | | | 359/586 |
| 2007/0176104 A1 | 8/2007 | Geneczko et al. | |
| 2009/0190225 A1* | 7/2009 | Yamada ................ G02B 1/105 | |
| | | | 359/580 |
| 2011/0123777 A1* | 5/2011 | Imaoku ................ G02B 1/118 | |
| | | | 428/172 |
| 2011/0266445 A1* | 11/2011 | Beratan ..................... G01J 1/02 | |
| | | | 250/338.4 |
| 2011/0308599 A1* | 12/2011 | Stangl ............... H01L 31/02244 | |
| | | | 136/256 |
| 2013/0298972 A1* | 11/2013 | Lin .......................... H01L 33/38 | |
| | | | 136/255 |
| 2014/0063609 A1* | 3/2014 | Iwata ..................... G02B 1/118 | |
| | | | 359/601 |
| 2014/0239179 A1 | 8/2014 | Novotny et al. | |
| 2015/0362707 A1* | 12/2015 | Sanghera ............... G02B 1/118 | |
| | | | 359/356 |

OTHER PUBLICATIONS

Apr. 21, 2016 International Search Report Issued in International Application No. PCT/US2015/043967.

* cited by examiner (a) Pyroelectric – Thick Metal (b) Thermoelectric – Thin Metal + QW dielectric (c) Thermoelectric – Thin Metal

_US 10,254,169 B2_

OPTICAL DETECTOR BASED ON AN ANTIREFLECTIVE STRUCTURED DIELECTRIC SURFACE AND A METAL ABSORBER

CROSS-REFERENCE TO RELATED APPLICATION

The present patent application/patent claims the benefit of priority of U.S. Provisional Patent Application No. 62/048,061, filed on Sep. 9, 2014, and entitled "OPTICAL DETECTOR BASED ON AN ANTIREFLECTIVE STRUCTURED DIELECTRIC SURFACE AND A METAL ABSORBER," the contents of which are incorporated in full by reference herein.

STATEMENT OF GOVERNMENT SPONSORED RESEARCH AND/OR DEVELOPMENT

The present invention was made with Government support by the Naval Research Laboratory, Award No. N00173 12-1-G020. Accordingly, the Government has certain rights in the present invention.

FIELD OF THE INVENTION

The present invention relates generally to thermal radiation detectors and the like for use in imaging, power detection, spectroscopy, and like applications. More specifically, the present invention relates to optical detectors based on antireflective structured dielectric surfaces and metal absorbers.

BACKGROUND OF THE INVENTION

A thermal radiation detector operates by converting incident radiation into heat. The radiation is absorbed by a structure, typically a metal film, and causes the temperature of the sensor to increase. This temperature change is measured by means of a variety of physical effects. Examples include temperature-dependent electric resistivity in bolometers, gas pressure in Golay cells, the Seebeck effect in thermopiles, and the pyroelectric effect in pyroelectric sensors. In all of these cases, it is desirable that the metallic absorber have high efficiency across the largest possible range of wavelengths and a low thermal mass. Existing solutions include detector architectures that incorporate (a) metal-black coatings, (b) thin metal coatings, and (c) quarter-wavelength (QW) spacer/absorber structures. Type (a) detectors are typically very fragile, type (b) detectors typically require very specific metal films due to the high-reflectivity properties of metals, and type (c) detectors are typically very efficient (approaching 100% absorption) at very specific wavelength bands, where the given QW spacer/absorber structure is most efficient. The latter type of detector has anti-nodes, making it inefficient at certain wavelengths within the absorption band of the metal film. The fabrication of type (c) detectors can be complicated, as metal and dielectric coatings have to be produced in different chambers for contamination reasons, and the QW spacer/absorber structures can be single or multi-layered dielectric structures of considerable complexity.

Thus, what is still needed in the art is an improved optical detector that operates efficiently over a wide wavelength range and that is simple to manufacture. Advantageously, the optical detector would permit the use of metal films that have previously been restricted due to their high-Fresnel reflection losses.

BRIEF SUMMARY OF THE INVENTION

In various exemplary embodiments, the present invention provides an improved optical detector for the detection of ultraviolet (UV), visible, and infrared (IR) wavelengths that incorporates a thin metal light-absorbing film deposited on the surface of a dielectric substrate with an antireflective structured surface (ARSS), and whose function is to detect optical radiation and convert it to an electrical stimulus. The ARSS provides major fabrication simplification of the optical detector, and permits the use of metal films that have previously been restricted due to their high-Fresnel reflection losses.

In one exemplary embodiment, the present invention provides an optical detector device, including: a metal absorber layer; and a dielectric cover layer coupled to the metal absorber layer, wherein the dielectric cover layer includes one or more antireflective structured surfaces. The optical detector device further includes one or more of a passive substrate layer and an active thermoelectric element layer coupled to the metal absorber layer opposite the dielectric cover layer. Optionally, the optical detector device further includes a dielectric insulator layer disposed adjacent to the metal absorber layer opposite the dielectric cover layer. Optionally, the optical detector device further includes a metal reflector layer disposed adjacent to the metal absorber layer opposite the dielectric cover layer. The metal absorber layer includes one or more of Nickel (Ni), Chrome (Cr), Silver (Ag), and Gold (Au). The dielectric cover layer includes one or more of Fused Silica (FS), BK7, SF11, Crown optical glass, Flint optical glass, and Borosilicate glass. The passive substrate layer includes one or more of Fused Silica (FS), BK7, SF11, Crown optical glass, Flint optical glass, and Borosilicate glass. The active thermoelectric element layer includes one or more of Indium Antimonide (InSb), Lead Selenide (Pb Se), Lead Sulfide (PbS), and Mercury-Cadmium Telluride (HgCdTe). The one or more antireflective structured surfaces each utilize a random pattern.

In another exemplary embodiment, the present invention provides an optical detector fabrication method, including: forming one or more antireflective structured surfaces on one or more surfaces of a dielectric cover layer; and disposing a metal absorber layer on one surface of the dielectric cover layer. The optical detector fabrication method further includes coupling one or more of a passive substrate layer and an active thermoelectric element layer to the metal absorber layer opposite the dielectric cover layer. Optionally, the optical detector fabrication method further includes disposing a dielectric insulator layer adjacent to the metal absorber layer opposite the dielectric cover layer. Optionally, the optical detector fabrication method further includes disposing a metal reflector layer adjacent to the metal absorber layer opposite the dielectric cover layer. The metal absorber layer includes one or more of Nickel (Ni), Chrome (Cr), Silver (Ag), and Gold (Au). The dielectric cover layer includes one or more of Fused Silica (FS), BK7, SF11, Crown optical glass, Flint optical glass, and Borosilicate glass. The passive substrate layer includes one or more of Fused Silica (FS), BK7, SF11, Crown optical glass, Flint optical glass, and Borosilicate glass. The active thermoelectric element layer includes one or more of Indium Antimonide (InSb), Lead Selenide (PbSe), Lead Sulfide (PbS), and Mercury-Cadmium Telluride (HgCdTe). The one or more antireflective structured surfaces each utilize a random pattern.

BRIEF DESCRIPTION OF THE DRAWINGS

The present invention is illustrated and described herein with reference to the various drawings, in which like reference numbers are used to denote like device components/method steps, and in which.

DETAILED DESCRIPTION OF THE INVENTION

Figure 1:
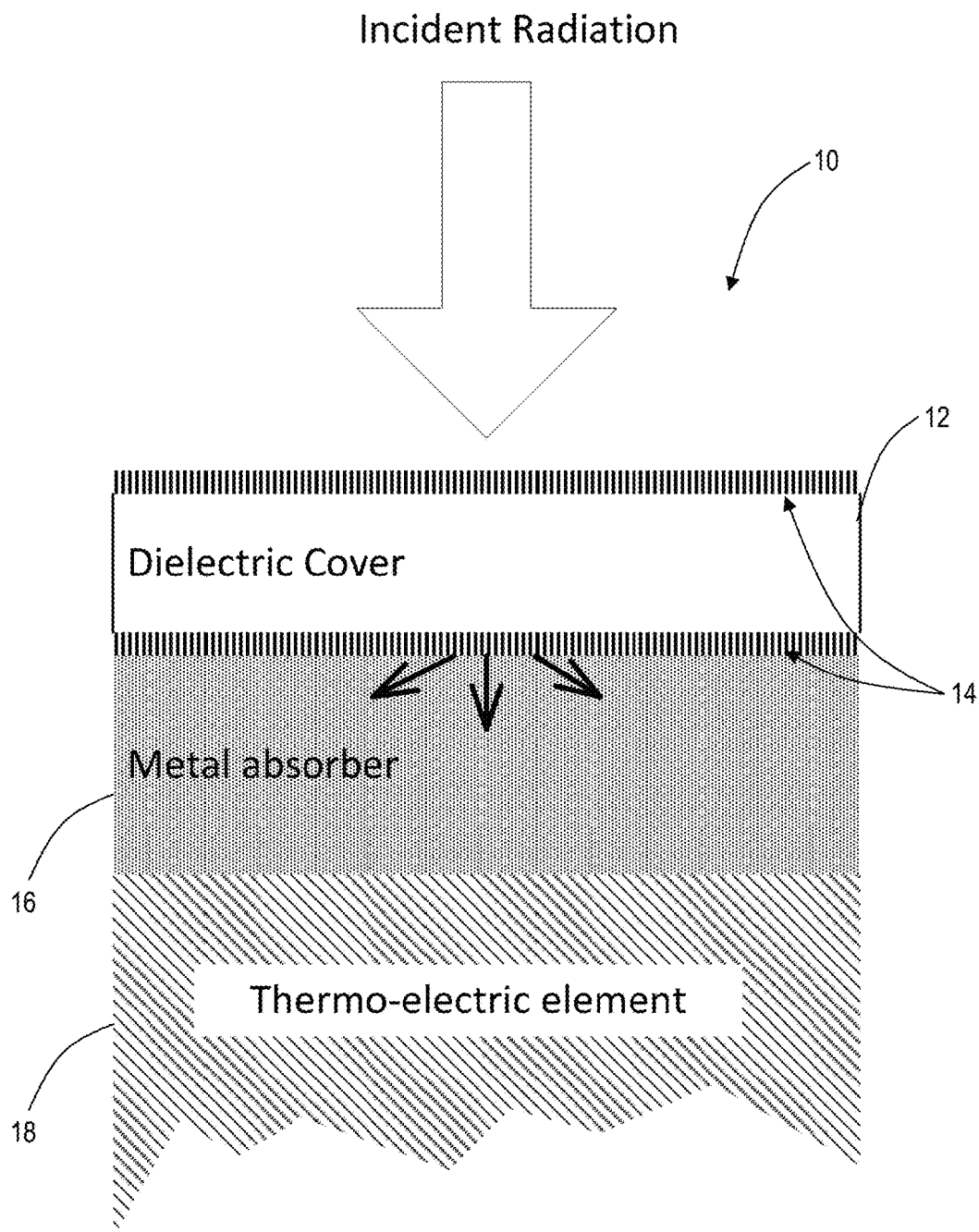
FIG. 1 is a schematic diagram illustrating one exemplary embodiment of the optical detector device of the present invention.
Figure 2:
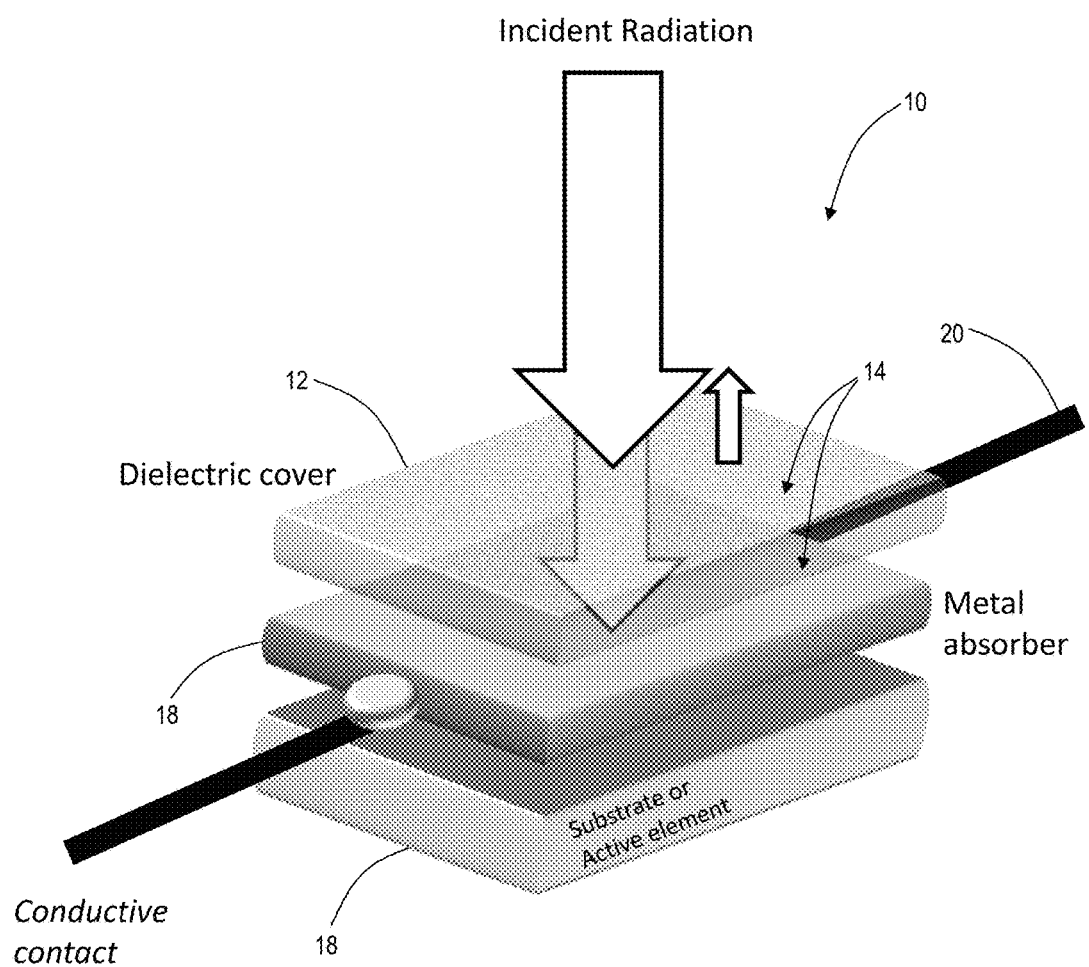
FIG. 2 is another schematic diagram illustrating one exemplary embodiment of the optical detector device of the present invention.

Referring now specifically to FIGS. 1 and 2, in one exemplary embodiment, the optical detector device 10 of the present invention includes a dielectric cover 12 including a double-sided ARSS 14 with high transmittance in the wavelength band of interest. The ARSS interfaces 14 minimize Fresnel reflectivity losses and increase absorption, due to an enhanced gradient transition profile between the dielectric cover 12 and a thin film metal absorber/electrode 16 to which the dielectric cover 12 is coupled. A substrate or active thermo-electric element 18 is used to support the thin film metal absorber/electrode 16. This configuration avoids the use of a multi-layered antireflective coating (MLAR) as the top layer, as well as a simple planar interface between the dielectric cover 12 and the thin film metal absorber/electrode 16. The configuration significantly relaxes the material and thickness requirements associated with the dielectric cover 12 and the thin film metal absorber/electrode 16. The broadband performance of the optical detector device 10 makes it an excellent candidate for the detection of radiation in spectral regions where specialized detectors are presently required.

By way of example only, the dielectric cover 12 is made of Fused Silica (FS), BK7, SF11, Crown optical glass, Flint optical glass, or Borosilicate glass and has a thickness of between about 0.50 mm and about 2.00 mm. The ARSS interfaces 14 consist of nanostructures that are on the order of 10 to 100 times smaller than the application wavelength requirement. These are needle-like, or erect "grass-type," blades, cones, or cylinders that are not deposited, but rather etched, on a planar substrate surface. They are distributed randomly on the planar substrate surface, and have random vertical extent (i.e. height). The roughness of the random needle-like features has a Gaussian distribution function histogram, with a maximum to minimum value ($R_z$) extent of a wavelength in size, and a root-mean-square ($R_q$) value between 1/3 and 1/2 wavelength. The transverse dimension (i.e. width) of the random needles is on the order of 1/10 to 1/3 that of the application wavelength. By way of example only, the ARSS interfaces 14 have a thickness of between about 200 nm and about 1000 nm. The ARSS interfaces 14 are manufactured by low pressure reactive-ion plasma etching or the like. Functionally, the ARSS interfaces 14 produce a continuous gradient optical refractive index profile at the interface region between the substrate and the ambient environment. This effectively increases the refractive index incrementally with depth into the substrate, but in a continuous fashion, without abrupt changes in the refractive index value. The gradient-index increase results in a reduction of the local sublayer-to-sublayer Fresnel reflectivity, and thus the reflectivity of the incident light is suppressed. Mathematically, this is equivalent to a smoothly increasing boundary condition for the dielectric constant of the substrate, which results in continuous wave propagation, without mismatching the electromagnetic impedance from sublayer-to-sublayer. Although a double-sided ARSS 14 is illustrated and described herein, in some exemplary embodiments, it may be desirable to utilize a single-sided ARSS 14 either proximal to or distal from the thin film metal absorber/electrode 16 with respect to the dielectric cover 12.

By way of example only, the thin film metal absorber/electrode 16 is made of Nickel (Ni), Chrome (Cr), Silver (Ag), or Gold (Au) and has a thickness of between about 50 nm and about 400 nm. Referring now specifically to FIG. 2, in one exemplary embodiment, the thin film metal absorber/electrode 16 is coupled to one or more conductive contacts 20 operable for receiving an transmitting an electrical output from the thin film metal absorber/electrode 16.

By way of example only, the substrate or active thermoelectric element 18 includes a bolometer, thermopile, pyroelectric sensor, or the like, well known to those of ordinary skill in the art. Thus, by varying the substrate or active thermo-electric element 18, the optical detector device 10 of the present invention can be used in a pyroelectric configuration, a passive thermoelectric configuration, or an active thermoelectric configuration.

Generally, the only substrates that may be excluded from this device implementation are substrates that absorb incident light at the desired application wavelengths. The only metal films that may be excluded from this device implementation are metals that do not absorb incident light at the desired application wavelengths, and thus are not able to result in a thermoelectric or electro-optic conversion.

Figure 3:
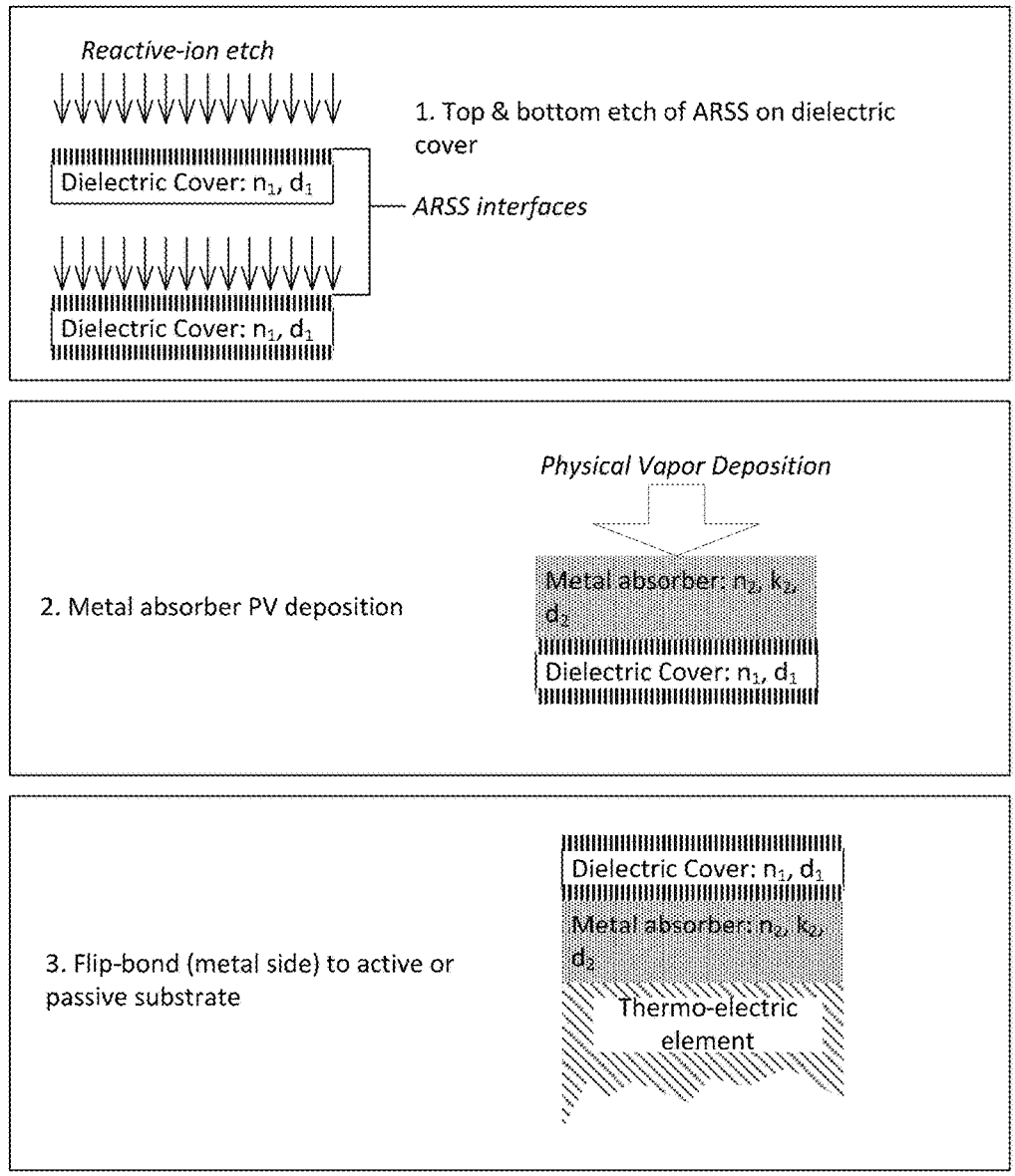
FIG. 3 is a series of schematic diagrams illustrating one exemplary embodiment of the method for fabricating the optical detector device of the present invention.

Referring now specifically to FIG. 3, in one exemplary embodiment, the dielectric cover 12 is processed on one or both optical surfaces using a reactive-ion etch or the like to form the ARSS 14, with a transmission >99.5% in the spectral region of interest, for example. The thin film metal absorber/electrode 16 is then deposited on one surface of the dielectric cover 12 by using an ion, sputtering, or evaporation technique, for example. The metal coated face is then bonded, using microelectronic techniques (i.e. wafer or chip bonding) or the like, on the passive or active substrate 18, or the thermo-electric material 18 is deposited on the metal film 16 using an ion, sputtering, or evaporation technique, for example. Optionally, the entire structure is then mounted on a substrate by bonding, or is mounted on a heat sink, if the fast detection of pulsed radiation is desirable, for example. The metal absorber 16 acts as the top electrode of the detector 10 in this configuration. Another electrode can be deposited on the backside of the thermo-electric material 18, if the detector design requires it. The novel detector 10 based on a random antireflection structured surface dielectric with a metal absorber operates as follows.

Referring again specifically to FIGS. 1 and 2, light incident on the face passes through the first ARSS interface 14 on the dielectric surface 12. The transmittance of the interface 14 is designed to give a value of greater than or equal to 99.5% transmittance across the entire spectral band of interest. The light then passes through the dielectric bulk material 12, without attenuation, since the dielectric 12 is chosen to have no appreciable absorption in the spectral region of interest. The light passes next through the second ARSS interface 14, which is between the dielectric 12 and the metal absorber 16. The light is not reflected at the interface 14, due to the suppression of the reflectivity achieved by the ARSS. If there is a small Fresnel reflection, it can be reduced by an appropriate choice of metal absorber 16, to fulfill the impedance matching condition between the metal and dielectric optical indices. The light is then absorbed in the metal absorber layer 16. The metal absorber layer 16 can be thicker than the metal skin depth, since there are no interference conditions to be observed. For conventional metal film detectors, this skin depth restriction arises from the need to have part of the incident light pass through the metal layer, in order to interact with the quarter-wavelength thick dielectric underlayer 18, so that the anti-reflection condition is fulfilled. Without this condition, the incident light passing through the metal/dielectric layers 16/14 will leak out of the substrate 18, thus reducing the efficiency of the detector 10. In all cases, once the light enters the metal region 16, there is a small amount of specular diffusion, due to the randomness of the interface 14. This effect increases the absorption and reduces possible interference. The ARSS structure 14 impacts the light wavefront coherence, such that it randomizes the phase along the wavefront, which decouples any interference effects between the interfaces 14. The thickness of the dielectric 12 (d1) and the metal absorber 16 (d2) does not have to be restricted to QW or any other wavelength multiple values. This design criterion is relaxed for such detectors 10, and is another novelty of the device architecture.

The optical detector 10 based on an ARSS dielectric substrate 12 with a thin film metal absorber 16 disclosed here impacts the defense and commercial sectors, and any sector in which the detection of UV, visible, and IR wavelengths is desirable. Currently used thin film detectors do not have uniform broadband response, due to the multi-layered AR coating harmonics (i.e. high absorption) and anti-harmonics (i.e. low absorption) that induce blind-bands in the optical spectrum. The use of an ARSS substrate 12 allows broadband transmittance through it, without harmonic effects, and the thickness of the substrate 12 becomes arbitrary. Currently used thin film detectors have specific thickness restrictions on the QW-dielectric layer. Further, the metal used for the thin film absorber/electrode 16 does not have to match the 50% absorption condition, as the current technology dictates, since impedance matching between the metal and the ambient is replaced by matching through propagation in the random surface interface 14 between the metal 16 and the substrate 12, thus minimizing Fresnel reflectivity. This current material restriction disqualifies the use of good conductors, such as silver, due to their high Fresnel reflection. Also, the thickness of the thin film absorber/electrode 16 does not have to be less than the metal skin depth, for high transmittance through it, since there is no "back-reflector" in the detector structure, such as using the current technology designs. The metal film absorber/electrode 16 can be thicker than present designs, in order to increase the total absorptivity in the spectral region of interest. Current metal film deposition techniques are capable of the application of a number of high absorption films. The replacement of the QW-dielectric layer and the MLAR, by the thickness independent ARSS substrate 12 simplifies the fabrication steps of the device 10, since only metal coating chambers are required for the detector structure.

Figure 4:
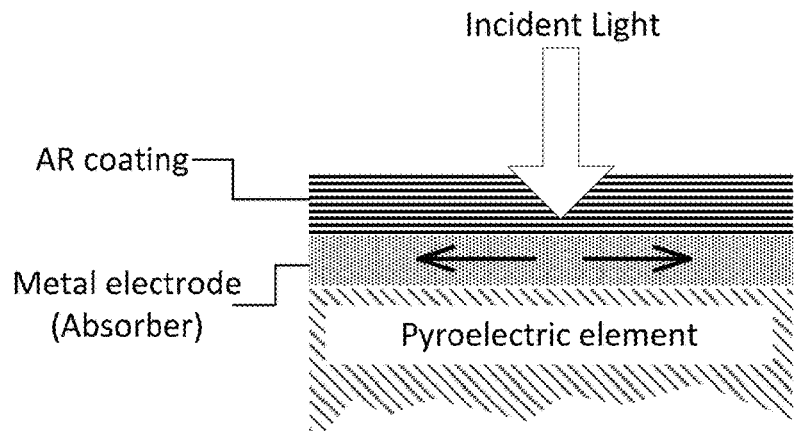
FIG. 4 is a series of schematic diagrams illustrating various types of metallic-film detectors in conjunction with the optical detector device and fabrication method of the present invention.
Figure 4:
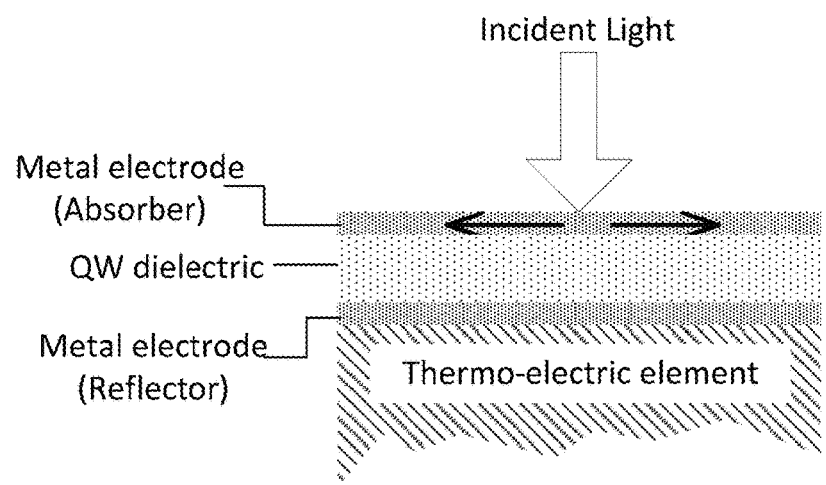
Figure 4:
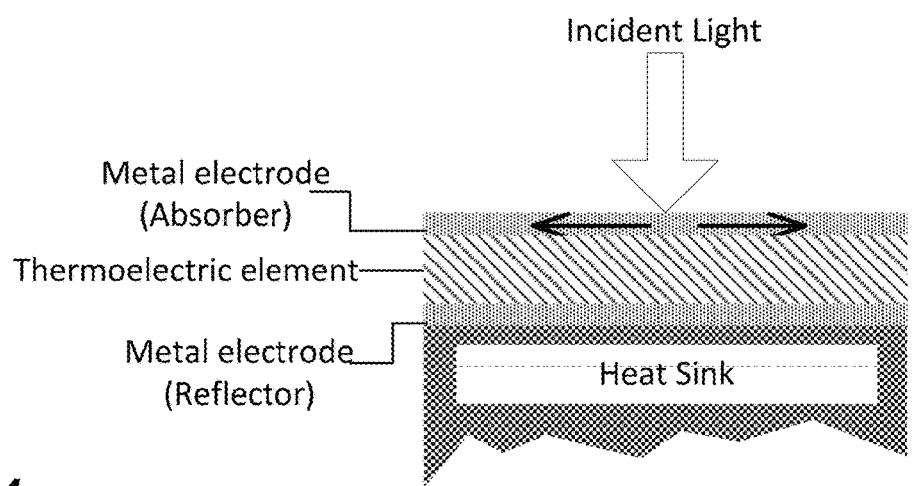

For reference, FIG. 4 is a series of schematic diagrams illustrating various types of metallic-film detectors in conjunction with the optical detector device and fabrication method of the present invention. The thick metal pyroelectric detectors include a complex MLAR top coating and light is absorbed in the thick metal layer. The rise in temperature of the metal is conducted to the pyroelectric substrate and is converted into an electrical signal. The thin metal QW-dielectric thermoelectric detectors absorb light in the top thin metal electrode, which is thinner than the metal skin depth. The light transmitted through the top electrode is then reflected by the bottom metal reflector and interferes with the QW-dielectric to enhance re-absorption on the top electrode. The thin metal thermoelectric detectors have higher efficiency than the single-layer thermoelectric coupling detectors, but the thermoelectric element must be transparent to incident radiation.

The complex MLAR top coating of the thick metal pyroelectric detectors leads to "blind" wavelength bands. An impedance matching layer partially addresses this issue, but requires the metal layer to be 50% absorbing. Advantageously, with the ARSS cover of the present invention, "blind" and harmonic wavelength bands are eliminated, the ARSS performs the function of the impedance matching layer, MLAR fabrication complexity is avoided, and metal films with high indices and good conductivity can be used. For the thin metal QW-dielectric thermoelectric detectors, the top metal electrode skin depth is a critical dimension, as is the QW-dielectric thickness, and the QW-dielectric optical response has harmonic wavelength maxima and minima. Advantageously, with the ARSS cover of the present invention, the top metal electrode skin depth is not a critical dimension, nor is the dielectric spacer thickness, and there are no spectral overtones.

Although the present invention is illustrated and described herein with reference to preferred embodiments and specific examples thereof, it will be readily apparent to those of ordinary skill in the art that combinations of these embodiments and examples and other embodiments and examples may perform similar functions and/or achieve like results. All such equivalent embodiments and examples are within the spirit and scope of the present invention, are contemplated thereby, and are intended to be covered by the following claims.

What is claimed is:

1. An optical detector device, comprising:
   a metal absorber layer; and
   a dielectric cover layer coupled to the metal absorber layer, wherein the dielectric cover layer comprises one or more antireflective structured surfaces, wherein the one or more antireflective structured surfaces comprise a plurality of randomly distributed needle-like structures each having a random height and a width between $1/10$ and $1/3$ of a wavelength of incident radiation, wherein a roughness of the randomly distributed needle-like structures has a Gaussian distribution function histogram with a maximum-to-minimum value ($R_z$) extent of a wavelength in size and a root-mean-square ($R_q$) value between $1/3$ and $1/2$ of a wavelength.

2. The optical detector device of claim 1, further comprising one or more of a passive substrate layer and an active thermoelectric element layer coupled to the metal absorber layer opposite the dielectric cover layer.

3. The optical detector device of claim 2, wherein the passive substrate layer comprises one or more of Fused Silica (FS), an optical glass, and Borosilicate glass.

4. The optical detector device of claim 2, wherein the active thermoelectric element layer comprises one or more of Indium Antimonide (InSb), Lead Selenide (Pb Se), Lead Sulfide (PbS), and Mercury-Cadmium Telluride (HgCdTe).

5. The optical detector device of claim 1, further comprising a dielectric insulator layer disposed adjacent to the metal absorber layer opposite the dielectric cover layer.

6. The optical detector device of claim 1, further comprising a metal reflector layer disposed adjacent to the metal absorber layer opposite the dielectric cover layer.

7. The optical detector device of claim 1, wherein the metal absorber layer comprises one or more of Nickel (Ni), Chrome (Cr), Silver (Ag), and Gold (Au).

8. The optical detector device of claim 1, wherein the dielectric cover layer comprises one or more of Fused Silica (FS), an optical glass, and Borosilicate glass.

9. The optical detector device of claim 1, further comprising one or more electrical contacts coupled to the metal absorber layer.

10. The optical detector device of claim 1, wherein the dielectric cover layer comprises a pair of antireflective structured surfaces located on opposed surfaces of the dielectric cover layer.

11. An optical detector fabrication method, comprising:
forming one or more antireflective structured surfaces on one or more surfaces of a dielectric cover layer, wherein the one or more antireflective structured surfaces comprise a plurality of randomly distributed needle-like structures each having a random height and a width between 1/10 and 1/3 of a wavelength of incident radiation, wherein a roughness of the randomly distributed needle-like structures has a Gaussian distribution function histogram with a maximum-to-minimum value ($R_z$) extent of a wavelength in size and a root-mean-square ($R_q$) value between 1/3 and 1/2 of a wavelength; and
disposing a metal absorber layer on one surface of the dielectric cover layer.

12. The optical detector fabrication method of claim 11, further comprising coupling one or more of a passive substrate layer and an active thermoelectric element layer to the metal absorber layer opposite the dielectric cover layer.

13. The optical detector fabrication method of claim 12, wherein the passive substrate layer comprises one or more of Fused Silica (FS), an optical glass, and Borosilicate glass.

14. The optical detector fabrication method of claim 12, wherein the active thermoelectric element layer comprises one or more of Indium Antimonide (InSb), Lead Selenide (Pb Se), Lead Sulfide (PbS), and Mercury-Cadmium Telluride (HgCdTe).

15. The optical detector fabrication method of claim 11, further comprising disposing a dielectric insulator layer adjacent to the metal absorber layer opposite the dielectric cover layer.

16. The optical detector fabrication method of claim 11, further comprising disposing a metal reflector layer adjacent to the metal absorber layer opposite the dielectric cover layer.

17. The optical detector fabrication method of claim 11, wherein the metal absorber layer comprises one or more of Nickel (Ni), Chrome (Cr), Silver (Ag), and Gold (Au).

18. The optical detector fabrication method of claim 11, wherein the dielectric cover layer comprises one or more of Fused Silica (FS), an optical glass, and Borosilicate glass.

19. The optical detector fabrication method of claim 11, further comprising coupling one or more electrical contacts to the metal absorber layer.

20. The optical detector fabrication method of claim 11, wherein forming the one or more antireflective structured surfaces on the one or more surfaces of the dielectric cover layer comprises forming a pair of antireflective structured surfaces on opposed surfaces of the dielectric cover layer.

* * * * *